(12) United States Patent
Ehteshamuddin et al.

(10) Patent No.: US 12,483,206 B2
(45) Date of Patent: Nov. 25, 2025

(54) BROADBAND LOW NOISE AMPLIFIERS WITH INTEGRATED LIMITERS AND FAST RECOVERY TIME

(71) Applicant: Analog Devices, Inc., Wilmington, MA (US)

(72) Inventors: Mohammed Ehteshamuddin, Woburn, MA (US); Song Lin, Lexington, MA (US); Christopher Hay, Colorado Springs, CO (US)

(73) Assignee: Analog Devices, Inc., Wilmington, MA (US)

( * ) Notice: Subject to any disclaimer, the term of this patent is extended or adjusted under 35 U.S.C. 154(b) by 439 days.

(21) Appl. No.: 18/181,321

(22) Filed: Mar. 9, 2023

(65) Prior Publication Data

US 2024/0305252 A1  Sep. 12, 2024

(51) Int. Cl.

| H03F 1/34 | (2006.01) |
| H03F 1/26 | (2006.01) |
| H03F 1/56 | (2006.01) |
| H03F 3/193 | (2006.01) |
| H03F 3/195 | (2006.01) |

(52) U.S. Cl.
CPC ............ *H03F 3/193* (2013.01); *H03F 1/26* (2013.01); *H03F 1/565* (2013.01); *H03F 3/195* (2013.01); *H03F 2200/294* (2013.01); *H03F 2200/451* (2013.01)

(58) Field of Classification Search
CPC ..................................... H03F 1/34; H03F 1/22
USPC ............................................ 330/293, 75, 311
See application file for complete search history.

(56) References Cited

U.S. PATENT DOCUMENTS

| 3,448,414 A | 6/1969 | Brunton |
| 3,636,321 A * | 1/1972 | Kirschner ................. G06G 7/28 |
| | | 708/845 |
| 3,816,765 A * | 6/1974 | Goyer ................... H03K 19/082 |
| | | 326/75 |
| 4,596,043 A | 6/1986 | Leitch |
| 4,829,299 A * | 5/1989 | Mandell ................ H03M 3/022 |
| | | 341/146 |
| 5,138,274 A | 8/1992 | Nakanishi et al. |

(Continued)

FOREIGN PATENT DOCUMENTS

| CN | 109995333 A | 7/2019 |
| FR | 3048831 A1 | 9/2017 |

OTHER PUBLICATIONS

Huang et al., "A 9-16 GHz monolithic HEMT low noise amplifier with embedded limiters," MTTS, May 1995 in 2 pages.

(Continued)

*Primary Examiner* — Henry Choe
(74) *Attorney, Agent, or Firm* — Knobbe, Martens, Olson & Bear, LLP

(57) ABSTRACT

Apparatus and methods for broadband low noise amplifiers (LNAs) with integrated limiters and fast recovery time are provided. In certain embodiments, an LNA includes a radio frequency (RF) amplification circuit, a feedback resistor connected along a feedback path from an output to an input of the RF amplification circuit, an input limiting circuit connected along an RF signal path between an RF input terminal and the input to the RF amplification circuit, and an input bias circuit that provides an input bias voltage to the input of the RF amplification circuit through the input limiting circuit.

20 Claims, 6 Drawing Sheets

(56) References Cited

U.S. PATENT DOCUMENTS

| | | | |
|---|---|---|---|
| 5,300,900 A | 4/1994 | Bellantoni | |
| 5,341,114 A | 8/1994 | Calviello et al. | |
| 5,886,572 A | 3/1999 | Myers et al. | |
| 6,049,703 A | 4/2000 | Staudinger et al. | |
| 7,009,462 B2 | 3/2006 | Kojima | |
| 7,515,000 B1 | 4/2009 | Jin et al. | |
| 7,755,435 B2 * | 7/2010 | Lu | H03F 3/60 330/311 |
| 8,102,214 B2 * | 1/2012 | Park | H03F 1/342 330/311 |
| 8,565,341 B2 | 10/2013 | Kousai | |
| 8,731,120 B1 | 5/2014 | Pike | |
| 8,903,340 B2 | 12/2014 | Chang et al. | |
| 8,918,068 B1 | 12/2014 | Helms et al. | |
| 9,379,675 B2 | 6/2016 | Nash et al. | |
| 10,084,416 B2 | 9/2018 | Wallis | |
| 10,171,043 B2 | 1/2019 | Nilsson | |
| 10,404,242 B1 | 9/2019 | Lappe et al. | |
| 10,629,553 B2 | 4/2020 | Soliman et al. | |
| 11,283,479 B2 | 3/2022 | Pednekar et al. | |
| 11,323,080 B2 * | 5/2022 | Tokuda | H04B 1/18 |
| 2009/0167467 A1 * | 7/2009 | Yamamoto | H03H 7/0161 348/731 |
| 2013/0065542 A1 | 3/2013 | Proudkii | |
| 2014/0285262 A1 | 9/2014 | Kojima et al. | |
| 2017/0271281 A1 | 9/2017 | Rodriguez et al. | |
| 2019/0296722 A1 | 9/2019 | Lu et al. | |
| 2020/0124705 A1 | 4/2020 | Bronocore et al. | |
| 2021/0399757 A1 | 12/2021 | Pednekar et al. | |

OTHER PUBLICATIONS

Liero et al., "On the Recovery Time of Highly Robust Low-Noise Amplifiers", MTTS, Apr. 2010, in 7 pages.

Lim et al., "Recovery Time of the Schottky-PIN Limiter", MWJ, Nov. 2012, in 4 pages.

Looney et al., "An Examination of Recovery Time of an Integrated Limiter/LNA," Microwave Magazine, Mar. 2004, in 3 pages.

Yang et al., "Codesign of Ka-Band Integrated GaAs PIN Diodes Limiter and Low Noise Amplifier" IEEE Access, Jun. 2019, in 7 pages.

* cited by examiner

BROADBAND LOW NOISE AMPLIFIERS WITH INTEGRATED LIMITERS AND FAST RECOVERY TIME

FIELD OF THE DISCLOSURE

Embodiments of the invention relate to electronics, and more particularly, to radio frequency (RF) amplifiers.

BACKGROUND

An RF communication system can include one or more low noise amplifiers (LNAs) for providing RF signal amplification. For example, an LNA can be used in an RF communication system to amplify relatively weak signals received by an antenna. The LNA can operate to provide initial amplification in a receive path to increase signal-to-noise ratio (SNR) of the received signal by providing gain to the signal while introducing a relatively small amount of noise.

Examples of RF communication systems with one or more LNAs include, but are not limited to, base stations, mobile devices (for instance, smartphones or handsets), laptop computers, tablets, and wearable electronics.

SUMMARY OF THE DISCLOSURE

Apparatus and methods for broadband low noise amplifiers (LNAs) with integrated limiters and fast recovery time are provided. In certain embodiments, an LNA includes a radio frequency (RF) amplification circuit, a feedback resistor connected along a feedback path from an output to an input of the RF amplification circuit, an input limiting circuit connected along an RF signal path between an RF input terminal and the input to the RF amplification circuit, and an input bias circuit that provides an input bias voltage to the input of the RF amplification circuit through the input limiting circuit.

In one aspect, an RF amplifier includes an RF input terminal configured to receive an RF input signal, an RF amplification circuit including an input and an output, a feedback resistor electrically connected between the output and the input of the RF amplification circuit, an input limiting circuit electrically connected between the RF input terminal and the input to the RF amplification circuit, and an input bias circuit configured to provide an input bias voltage to the input of the RF amplification circuit through the input limiting circuit.

In another aspect, a method of RF signal amplification and limiting is provided. The method includes receiving an RF input signal at an RF input terminal, limiting the RF input signal using an input limiting circuit electrically connected between the RF input terminal and an input to an RF amplification circuit, providing feedback from an output of the RF amplification circuit to the input of the RF amplification circuit using a feedback resistor, and providing an input bias voltage from an input bias circuit to the input of the RF amplification circuit through the input limiting circuit.

In another aspect, an RF communication system includes an antenna and an RF amplifier configured to amplify an RF input signal received from the antenna. The RF amplifier includes an RF amplification circuit including an input and an output, a feedback resistor electrically connected between the output and the input of the RF amplification circuit, an input limiting circuit electrically connected between the antenna and the input to the RF amplification circuit, and an input bias circuit configured to provide an input bias voltage to the input of the RF amplification circuit through the input limiting circuit

DETAILED DESCRIPTION OF EMBODIMENTS

Figure 1:
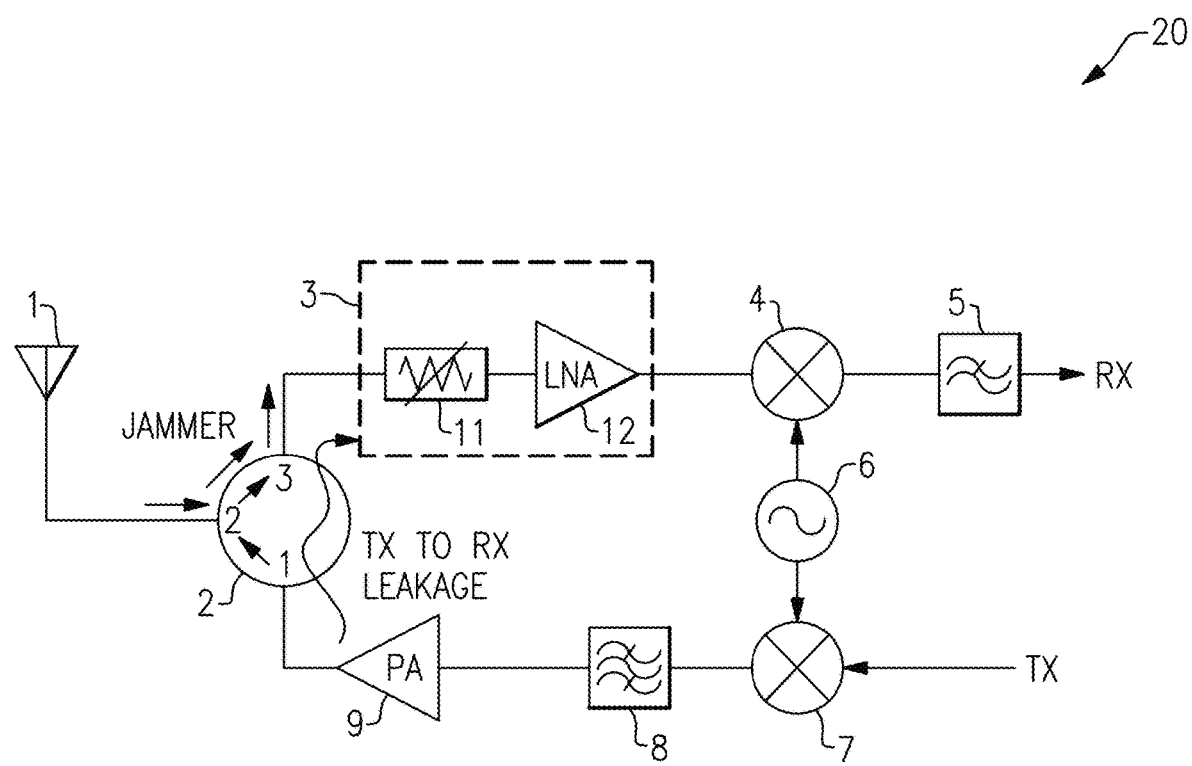
FIG. 1 is a schematic diagram of an RF communication system according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency (RF) communication system communicates by wirelessly transmitting and receiving RF signals. To provide amplification to a relatively weak RF signal received from an antenna, the RF communication system can include a low noise amplifier (LNA). The LNA can provide amplification to the received RF signal while introducing a relatively small amount of noise, thereby enhancing signal-to-noise ratio (SNR) and allowing the RF communication system to receive signals at far distances, in noisy radio environments, and/or from relatively weak transmitters.

Although an LNA typically provides amplification to weak signals of low power, an LNA can receive a relatively strong input signal during certain operating scenarios or time instances. For example, the LNA may receive a blocker or jammer signal and/or RF leakage can couple from the transmit path to the receive path. Absent a protection mechanism, such high power signals can cause damage to the LNA and/or other circuitry of a receiver.

To prevent damage arising from high power signals, RF limiters can be employed in the signal path before the LNA. For example, the LNA is typically the first active component in the receive signal chain, and thus performing signal limiting before the LNA case serve to protect receive path circuitry. Examples of components used for RF limiting include PIN diodes and/or Schottky diodes.

The performance of an RF limiter can be evaluated by a number of parameters. For instance, examples of key performance metrics for RF limiters include maximum power handling, flat leakage, recovery time, insertion loss, and/or return loss. Recovery time is an amount of time taken by the RF limiter to return to a low loss state from a high loss state, after termination of an incident high power signal.

Existing RF limiting schemes can be insufficient for certain applications, including broadband amplification. For example, broadband LNAs that cover the high frequency (HF) range (between 3 MHz and 30 MHz) to tens of GHz or higher (for example, millimeter wave frequencies), can use large value resistor, inductor, and/or capacitor (R/L/C) components to achieve operation at HF. However, such large value components on the input bias network and/or input matching network tend to be high resistance for handling HF signals. The high resistance impacts the current/voltage recovery (for example, at transistor gate or base) after the high power RF signal is terminated. Accordingly, recovery times in such LNAs are dominated by large time constants arising from R/L/C passives.

Apparatus and methods for broadband LNAs with integrated limiters and fast recovery time are provided. In certain embodiments, an LNA includes an RF amplification circuit, a feedback resistor connected along a feedback path from an output to an input of the RF amplification circuit, an input limiting circuit connected along an RF signal path between an RF input terminal and the input to the RF amplification circuit, and an input bias circuit that provides an input bias voltage to the input of the RF amplification circuit through the input limiting circuit.

Accordingly, the input bias circuit is isolated from the RF signal path and the large signal conditions that can occur thereon. In certain implementations, the input bias circuit and the RF amplification circuit are formed on a common IC, and an external choke inductor is included between the input bias circuit and the input limiting circuit. Thus, an off-chip choke inductor can be used to further isolate the input bias circuit from the RF signal path. Since the choke inductor is off-chip, the inductor can be implemented as a large value/high inductance surface mount device (SMD) to help to extend the low frequency limit and enable broadband operation.

In certain implementations, the feedback resistor is connected from the output to the input of the RF amplification circuit with no intervening capacitor. Thus, rather than resistor-capacitor (RC) feedback, shunt resistance-only feedback can be used. The absence of a capacitor in the feedback network helps to extend the low frequency limit of the amplifier. Additionally, a current sinking resistor can be connected between a bias output of the input bias circuit and ground. The current sinking resistor serves to sink the feedback current flowing through the feedback resistor to prevent the feedback current from interfering with nominal bias conditions of the RF amplification circuit.

The input limiting circuit can be implemented without any DC blocking capacitors. Rather, a DC blocking capacitor to be moved out of the discharge path for input limiting, thereby achieving faster recovery time.

The RF amplification circuit and the input bias circuit can be implemented in a wide variety of ways. In one embodiment, the RF amplification circuit is a cascode amplification stage, and the input bias circuit is implemented as a current mirror for generating the input bias voltage for the cascode amplification stage.

Using a current mirror to generate the input bias voltage reduces impacts arising from process variation, inhibits the input bias voltage from going negative in response to a large RF input pulse, and/or helps recovery of the input bias voltage to a nominal value after the input pulse is terminated. Moreover, the value of the input bias voltage is easily adjustable by selecting a voltage level of a bias reference voltage to the current mirror.

Accordingly, various features of the disclosure allow for both fast recovery time and extended low frequency band limit to be achieved. In contrast, broadband LNAs suffer from poor recovery time and/or poor frequency range at the low limit.

In certain implementations, the input limiting circuit includes at least one stage of anti-parallel diode limiters. Since the input bias circuit provides the input bias voltage to the input of the RF amplification circuit through the input limiting circuit, the input bias voltage also serves to bias the input limiting circuit (for example, the bias voltages across the anti-parallel diodes). Either the forward or reverse biased limiter diodes can be stacked unevenly to compensate for the input bias voltage lowering the diode turn-on threshold.

FIG. 1 is a schematic diagram of an RF communication system 20 according to one embodiment. The RF communication system 20 includes an antenna 1, a duplexer 2, an LNA with integrated limiter 3, a receive-path mixer 4, a receive-path filter 5, a local oscillator (LO) 6, a transmit-path mixer 7, a transmit-path filter 8, and a power amplifier 9.

Although, the RF communication system 20 of FIG. 1 illustrates one example of an electronic system that can include an LNA, LNAs can be used in other configurations of electronic systems. Additionally, although a particular configuration of components is illustrated in FIG. 1, the RF communication system 20 can be adapted and modified in a wide variety of ways. For example, the RF communication system 20 can include more or fewer receive paths and/or transmit paths. Additionally, the RF communication system 20 can be modified to include a different arrangement of components and/or more or fewer components, for example, additional LNAs.

The transmit-path mixer 7 receives a transmit signal TX, which the transmit-path mixer 7 upconverts to RF using a transmit LO signal from the LO 6. In certain implementations, the transmit signal TX is an intermediate frequency (IF) signal provided by an in-phase/quadrature-phase (I/Q) modulator of a transceiver.

As shown in FIG. 1, the transmit-path filter 8 filters the RF transmit signal from the transmit-path mixer 7 to generate a filtered RF transmit signal that is provided to an input of the power amplifier 9. In certain implementations, the transmit-path filter 8 is implemented as a bandpass filter. The power amplifier 9 amplifies the filtered RF transmit signal to generated an amplified RF transmit signal that is provided to the antenna 1 by way of the duplexer 2. The duplexer 2 can be implemented in a wide variety of ways, and is graphically depicted as a circulator in this example. However, arrangements using other types of duplexing and/or various types of switching are also possible.

In the illustrated embodiment, the LNA with integrated limiter 3 includes an RF limiter 11 and an LNA 12. Additionally, the LNA with integrated limiter 3 receives an RF receive signal from the antenna 1 by way of the duplexer 2.

The LNA 12 amplifies the RF receive signal to generate an amplified RF receive signal that is provided to the receive-path mixer 4, which downconverts the amplified RF receive signal using a receive LO signal from the LO 6. The downconverted receive signal is filtered by the receive-path filter 5 to generate a receive signal RX. In certain implementations, the receive-path filter 5 is implemented as a low pass filter. The receive signal RX can be subsequently processed in a wide variety of ways. In certain implementations, the receive signal RX is an IF signal provided to an I/Q demodulator of a transceiver for further processing.

The presence of high power jamming signals in the receiver spectrum (for example, signal JAMMER in FIG. 1) and/or RF leakage from the transmit path to the receive path (TX to RX leakage through the duplexer 2 in FIG. 1) can damage receive-path circuits. To prevent this, the RF limiter 11 is included before the LNA 12, which is typically the first active component in the receive signal chain. Accordingly, The RF limiter 11 serves to limit the RF receive signal to thereby protect the LNA 12 from damage.

The LNA with integrated limiter 3 can be formed on an integrated circuit (IC), which is also referred to herein a semiconductor die. Integrating the RF limiter 11 and the LNA 12 on the same IC has many advantages, such as lower loss, lower added noise, smaller form factor, lower cost, and/or potential for higher levels of integration with the rest of the receiver components.

The RF communication system 20 can handle RF signals of a wide range of frequencies, including not only those between 3 MHz and 7 GHz, but also higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide range of radio frequencies, including microwave frequencies.

Moreover, RF communication system 20 can wirelessly communicate RF signals associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

Figure 2:
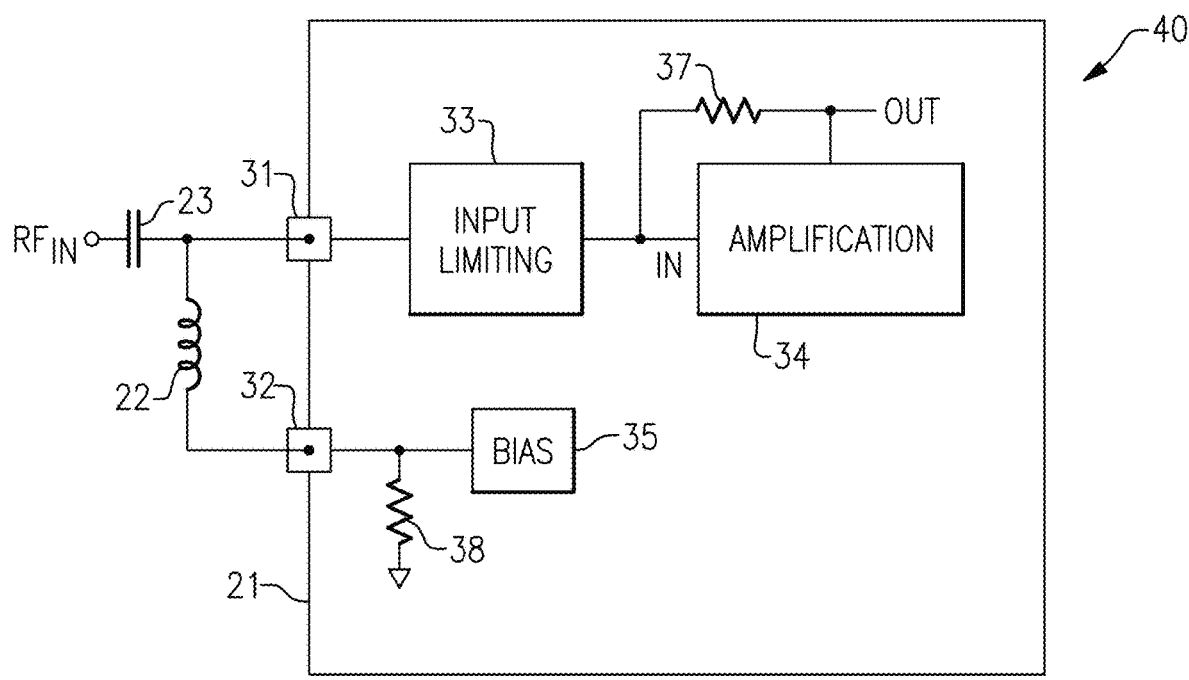
FIG. 2 is a schematic diagram of an RF amplifier according to one embodiment.

FIG. 2 is a schematic diagram of an RF amplifier 40 according to one embodiment. The RF amplifier 40 includes an IC 21 as well as various external components including a choke inductor 22 and a DC blocking capacitor 23. In certain implementations, the IC 21 and the external components are attached to a circuit board.

The RF amplifier 40 of FIG. 2 depicts one embodiment of an RF amplifier implemented in according with the teachings herein. The RF amplifier 40 is suitable for including in a receive path of an RF communication system to operate as an LNA. Although one embodiment of an RF amplifier is depicted in FIG. 2, the teachings herein are applicable to RF amplifiers implemented in other ways.

In the illustrated embodiment, the IC 21 includes an RF input signal pin or pad 31, a bias pad 32, an input limiting circuit 33, an RF amplification circuit 34, an input bias circuit 35, a feedback resistor 37, and a current sinking resistor 38. For clarity of the figures, only certain components of the IC 21 are depicted. However, the IC 21 can include additional circuitry and pads. Such details are omitted for clarity of the figure. In one example, the IC 21 further includes pads for power, ground, an RF output signal, control, and/or other functionality.

The RF amplifier 40 includes an RF input terminal $RF_{IN}$ for receiving an RF input signal. The DC blocking capacitor 23 is connected between the RF input terminal $RF_{IN}$ and the RF input signal pad 31. Additionally, the choke inductor 22 is connected between the RF input signal pad 31 and the bias pad 32.

With continuing reference to FIG. 2, the feedback resistor 37 is connected along a feedback path from an output (OUT) to an input (IN) of the RF amplification circuit 34. Additionally, the input limiting circuit 33 is connected along an RF signal path between the RF input terminal $RF_{IN}$ and the input to the RF amplification circuit 34. Additionally, the input bias circuit 35 provides an input bias voltage to the input of the RF amplification circuit 34 through the inductor 22 and the input limiting circuit 33.

Accordingly, the input bias circuit 35 is isolated from the RF signal path and the large signal conditions that can occur thereon. Additionally, the off-chip choke inductor 22 is used to further isolate the input bias circuit 35 from the RF signal path. Since the choke inductor 22 is off-chip (external to the IC 21), the inductor 22 can be implemented as a large value/high inductance SMD to help to extend the low frequency limit and enable broadband operation of the RF amplifier 40.

As shown in FIG. 2, the feedback resistor 37 is connected from the output to the input of the RF amplification circuit 34 with no intervening capacitor. The absence of a capacitor in the feedback network helps to extend the low frequency limit of the RF amplifier 40. Additionally, the current sinking resistor 38 is connected between the bias output of the input bias circuit 35 and ground.

The current sinking resistor 38 serves to sink the feedback current through the feedback resistor 37 to prevent feedback current from interfering with nominal bias conditions of the RF amplification circuit 34. In addition to keeping the current sink path low resistance, the current sinking resistor 38 also shorts high gain and provides low frequency stability, eliminating a need for a shunt resistor-inductor-capacitor (RLC) network on the input to thereby significantly improve recovery time.

Figure 3:
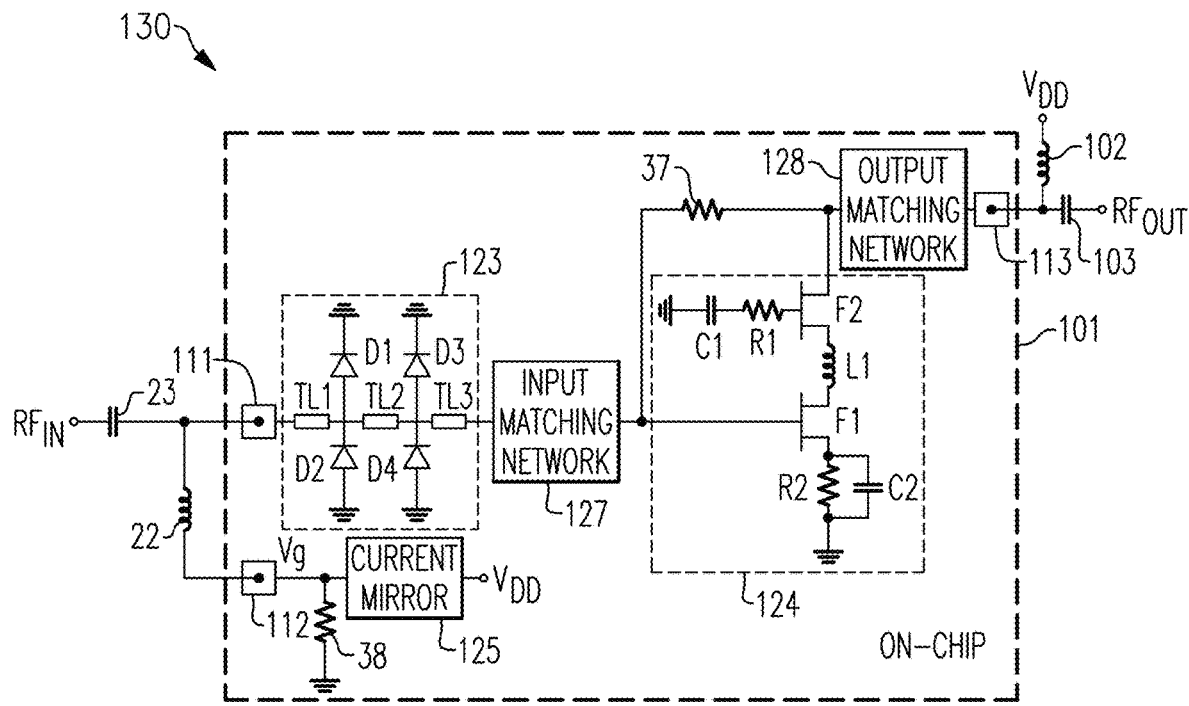
FIG. 3 is a schematic diagram of an RF amplifier according to another embodiment.

FIG. 3 is a schematic diagram of an RF amplifier 130 according to another embodiment. The RF amplifier 130 includes an IC 101 as well as various external components including an input choke inductor 22, an input DC blocking capacitor 23, an output choke inductor 102, and an output DC blocking capacitor 103. The IC 101 includes an RF input signal pad 111, a bias pad 112, an RF output signal pad 113, an input limiting circuit 123, a cascode amplification circuit 124, a current mirror 125, an input matching network 127, an output matching network 128, a feedback resistor 37, and a current sinking resistor 38.

The RF amplifier 130 includes an RF input terminal $RF_{IN}$ for receiving an RF input signal. The input DC blocking capacitor 23 is connected between the RF input terminal $RF_{IN}$ and the RF input signal pad 111. Additionally, the input choke inductor 22 is connected between the RF input signal pad 111 and the bias pad 112. The output DC blocking capacitor 103 is connected between the RF output signal pad 113 and the RF output terminal $RF_{OUT}$. Additionally, the output choke inductor 102 is connected between a power supply voltage $V_{DD}$ and the RF output signal pad 113.

In the illustrated embodiment, the cascode amplification circuit or stage 124 includes an amplification field-effect transistor (FET) F1, a cascode FET F2, a cascode gate resistor R1, a cascode gate capacitor C1, a source resistor R2, a source capacitor C2, and a series inductor L1. The cascode amplification circuit 124 includes an input corresponding to a gate of the amplification FET F1 and an output corresponding to a drain of the cascode FET F2. Although one embodiment of an RF amplification circuit is depicted, other types of RF amplification circuits can be used in accordance with the teachings herein. For example, RF amplification circuits using other amplifier topologies and/or transistor types (including, but not limited to, bipolar transistors) are possible.

The feedback resistor 37 is connected from the output to the input of the cascode amplification circuit 124. The absence of a capacitor in the feedback network of the cascode amplification circuit 124 helps to extend the low frequency limit of the RF amplifier 130. Since no feedback capacitor is present, a feedback current through the feedback resistor 37 flows through the input matching network 127, the input limiting circuit 123, and the input choke inductor 22 to the current sinking resistor 38. The current sinking resistor 38 is connected between a bias output of the current mirror 125 and ground, and serves to sink the feedback current.

With continuing reference to FIG. 3, the output matching network 128 is connected between the output of the cascode amplification circuit 124 and the RF output signal pad 113. Additionally, the input matching network 127 is connected between the input limiting circuit 123 and the input of the cascode amplification circuit 124. Furthermore, the series inductor L1 is connected between the source of the cascode FET F2 and a drain of the amplification FET F1. Additionally, the cascode gate resistor R1 and the cascode gate capacitor C1 are connected in series between a gate of the cascode FET F2 and ground. Furthermore, the source resistor R2 and the source capacitor C2 are connected in parallel with one another between a source of the amplification FET F1 and ground.

In the illustrated embodiment, the input limiting circuit 123 includes a first transmission line TL1, a second transmission line TL2, and a third transmission line TL3 connected in series along a portion of the RF signal path between the RF input signal pad 111 and the input matching network 127. Additionally, the input limiting circuit 123 includes two stages of anti-parallel diodes including a first diode D1, a second diode D2, a third diode D3, and a fourth diode D4. The first diode D1 includes an anode connected to the RF signal path and a cathode connected to ground, and is referred to as a forward diode. Additionally, the second diode D2 includes an anode connected to ground and a cathode connected to the RF signal path, and is referred to as a reverse diode. Furthermore, the third diode D3 includes an anode connected to the RF signal path and a cathode connected to ground, and is also a forward diode. Additionally, the fourth diode D4 includes an anode connected to ground connected to the RF signal path, and is also a reverse diode. With respect to impedance matching, the diodes D1-D4 are absorbed into the input matching network 127.

In broadband designs with low frequency limit in the HF range, the limiter diodes themselves are not the bottleneck for recovery time. Rather, the presence of large R/L/C passives limit recovery time. Thus, the RF amplifier 130 has been arranged to limit the presence of such R/L/C passives from the discharge path for input limiting.

In certain implementations, the diodes D1 and D2 in the first stage of the limiter are larger in area or periphery compared to the diodes D3 and D4 of the second stage. Thus, the first stage determines a maximum power handling of the limiter. When the incident RF input pulse rises above the threshold of the first limiter stage, the leakage power goes to the next stage and is further attenuated. The diodes D3 and D4 of the second stage are smaller in area and thus determine the flat leakage power to the amplifier core. In certain implementations, the diodes in the first stage and/or the second stage are stacked in order to reduce an effective capacitance of the input limiting circuit.

Although one embodiment of an input limiting circuit is depicted in FIG. 3, the RF amplifiers herein can be implemented with other types of input limiting circuits.

The input DC blocking capacitor 23 is connected between the RF input terminal $RF_{IN}$ and the RF input signal pad 111. Thus, the input DC blocking capacitor 23 is moved out of the discharge path for input limiting, thereby achieving faster recovery time.

With continuing reference to FIG. 3, the current mirror 125 receives the supply voltage $V_{DD}$ and outputs a gate voltage Vg for biasing the input of the cascode amplification circuit 124. In particular, the gate voltage Vg is provided from the bias output of the current mirror 125 to the gate of the amplification FET F1 along a circuit path that includes the bias pad 112, the input choke inductor 22, the RF input signal pad 111, the input limiting circuit 123, and the input matching network 127.

The gate voltage Vg also serves to bias the diodes D1-D4 of the input limiting circuit 123. In certain implementations, a size of the forward diodes D1/D3 can be asymmetric relative to that of the reverse diodes D2/D4. Additionally or alternatively, a different number of diodes can be included in series in the forward direction (from anode-to-cathode from the RF signal path to ground) relative to the number of diodes in series in the reverse direction (from cathode-to-anode from the RF signal path to ground). Accordingly, either forward or reverse biased limiter diodes can be stacked unevenly to compensate for the gate bias of the amplification FET F1 and lower the diode turn-on threshold.

In the illustrated embodiment, the current mirror 125 is isolated from the RF signal path by the arrangement of components including the input choke inductor 22. The input choke inductor 22 is off-chip (external to the IC 101), and can be implemented as a large value/high inductance SMD to help to extend the low frequency limit and enable broadband operation.

In the illustrated embodiment, the RF amplification circuit is a cascode amplification stage 124, and the input bias circuit is implemented as a current mirror 125. Using the current mirror 125 helps reduce impacts from process variation, inhibits the gate bias voltage Vg from going negative in response to a large RF input pulse, and/or helps recovery of the gate bias voltage Vg to a nominal value when the pulse is terminated. Moreover, the value of the gate voltage Vg can be adjustable by a bias reference voltage (not shown in FIG. 3) to the current mirror 125.

Figure 4:
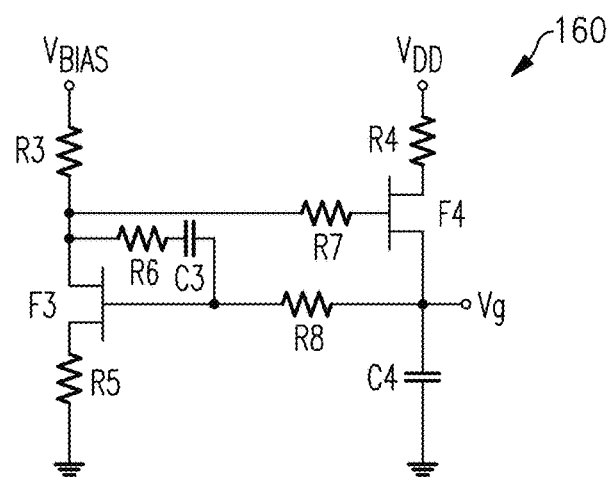
FIG. 4 is a schematic diagram of one embodiment of a current mirror for biasing an RF amplifier.

FIG. 4 is a schematic diagram of one embodiment of a current mirror 160 for biasing an RF amplifier. The current mirror 160 includes a first resistor R3, a second resistor R4, a third resistor R5, a fourth resistor R6, a fifth resistor R7, a sixth resistor R8, a first capacitor C3, a second capacitor C4, a first FET F3, and a second FET F4. The current mirror 160 is powered by a power supply voltage $V_{DD}$ and receives a reference bias voltage $V_{BIAS}$, which is adjustable to control a voltage level of a gate bias voltage Vg generated by the current mirror 160.

Although one embodiment of a current mirror is shown in FIG. 4, other implementations of current mirrors are possible. Moreover, the RF amplifiers herein can be biased by other types of input bias circuits aside from current mirrors. Accordingly, other implementations are possible.

In the illustrated embodiment, the first resistor R3 is connected between the reference bias voltage $V_{BIAS}$ and a drain of the first FET F3. Additionally, the second resistor R4 is connected between the power supply voltage $V_{DD}$ and a drain of the second FET F4. Furthermore, the third resistor R5 is connected between a source of the first FET F3 and ground. Additionally, the first capacitor C3 and the fourth resistor R6 are connected in series between a gate and drain of the first FET F3. Furthermore, the fifth resistor R7 is connected between the drain of the first FET F3 and a gate of the second FET F4. Additionally, the sixth resistor R8 is connected between the gate of the first FET F3 and a source of the second FET F4. Furthermore, the second capacitor C4 is connected between the source of the second FET F4 and ground. The source of the second FET F4 serves as a bias output that provides the gate bias voltage Vg.

In the illustrated embodiment, the first FET F3 and the second FET F4 are arranged to provide current mirroring with the second FET F4 also serving as a source follower. The second FET F4 moves a bias of the first FET F3 away from a knee region, thereby reducing the impact of process variation on changes in current.

Figure 5A:
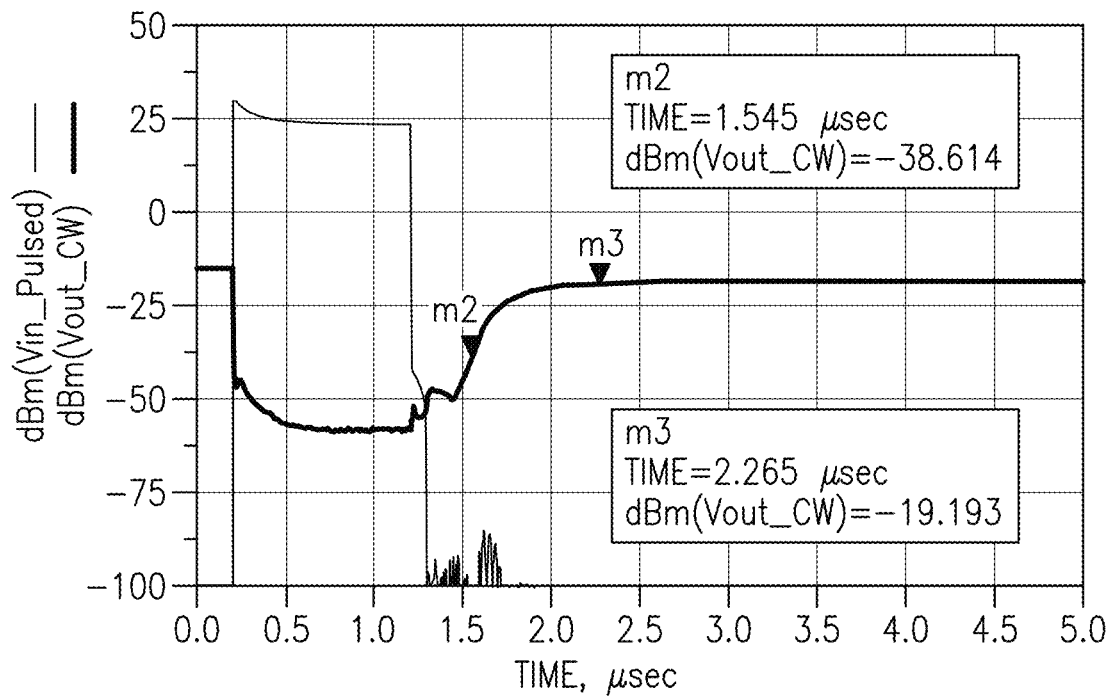
FIG. 5A is a graph of one example of amplifier input power and output power versus time in response to a high power pulse.
Figure 5B:
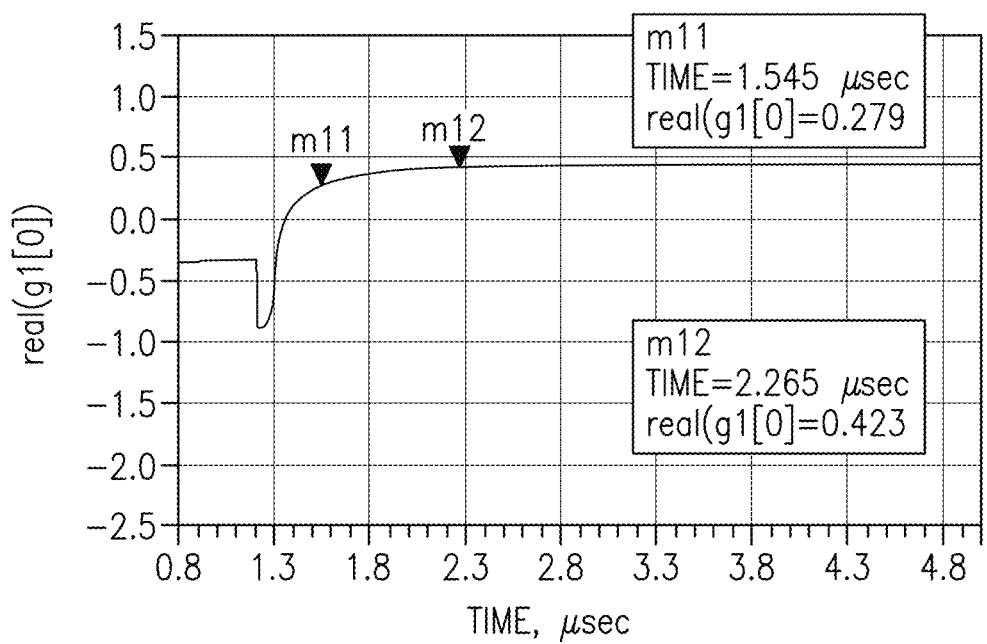
FIG. 5B is a graph of one example of amplifier gate voltage versus time in response to a high power pulse.

FIG. 5A is a graph of one example of amplifier input power and output power versus time in response to a high power pulse. The graph is depicted for a high power pulse at 7.5 GHz and for LNA output at 9.6 GHz. FIG. 5B is a graph of one example of amplifier gate voltage versus time in response to a high power pulse.

The graphs of FIGS. 5A and 5B are depicted for an example of an LNA in which an input bias circuit biases an input of an RF amplification circuit directly through an on-chip resistor, in which a DC blocking capacitor is present between an input limiting circuit and the input of the RF amplification circuit, and in which a resistor and a capacitor are connected in series to provide feedback between the input and the output of the RF amplification circuit.

As shown in FIGS. 5A and 5B, the presence of the R and C components results in slow recovery time and large perturbations in the LNA's biasing in response to the high power input pulse. For example, the LNA exhibits 720 ns recovery time.

Figure 5C:
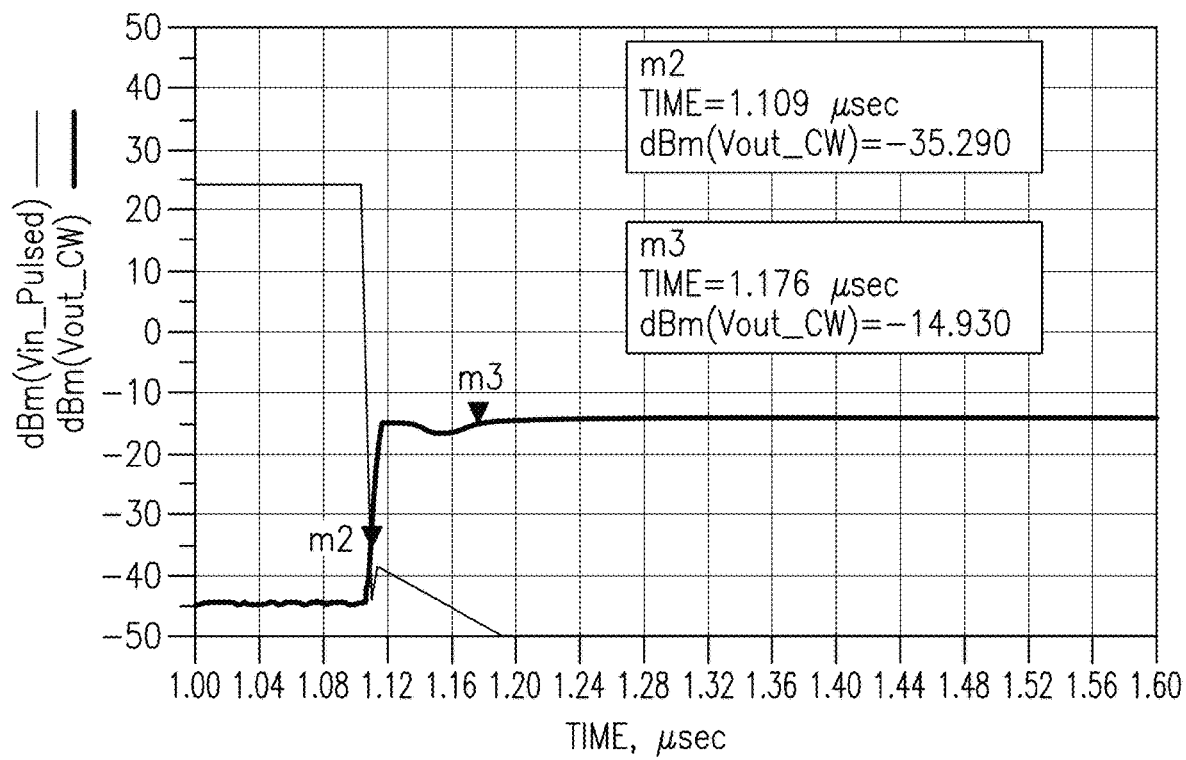
FIG. 5C is a graph of another example of amplifier input power and output power versus time in response to a high power pulse.
Figure 5D:
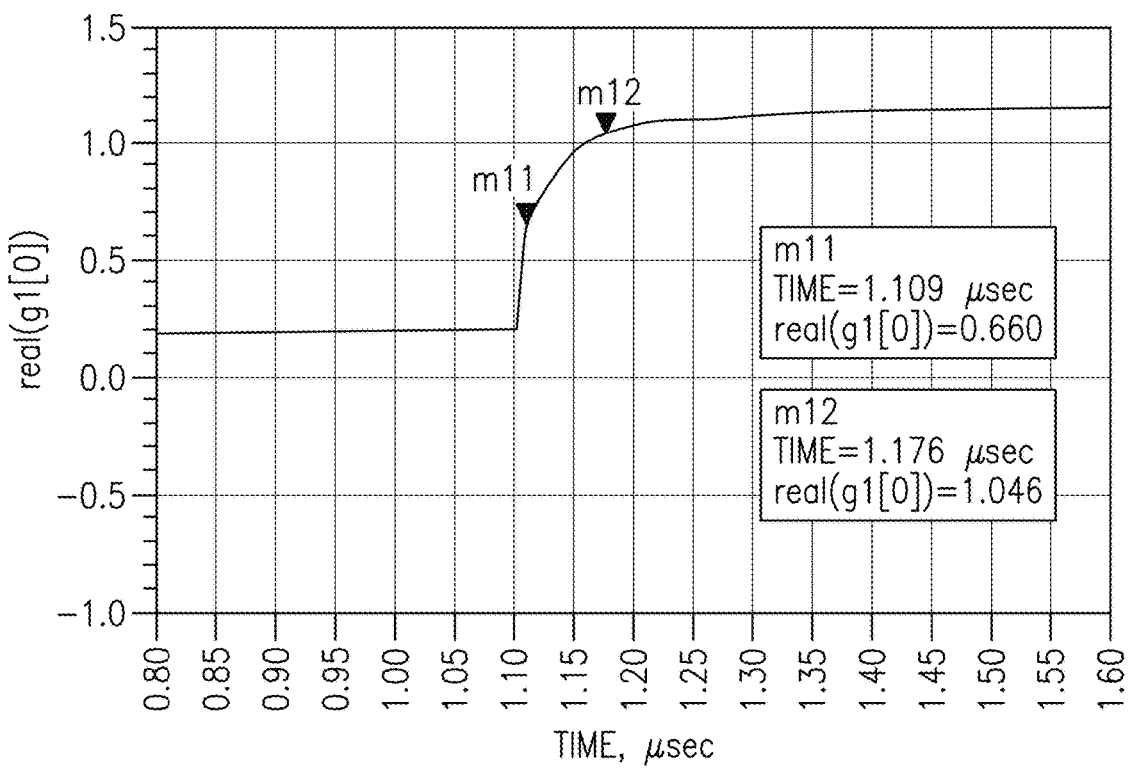
FIG. 5D is a graph of another example of amplifier gate voltage versus time in response to a high power pulse.

FIG. 5C is a graph of another example of amplifier input power and output power versus time in response to a high power pulse. The graph is depicted for a high power pulse at 7.5 GHz and for LNA output at 9.6 GHz. FIG. 5D is a graph of another example of amplifier gate voltage versus time in response to a high power pulse.

The graphs of FIGS. 5C and 5D are depicted for an example of an LNA implemented in accordance with the embodiments of FIGS. 3 and 4. In contrast to the graphs of FIGS. 5A and 5B, the graphs of FIGS. 5C and 5D exhibit fast recovery time and a small amount of biasing perturbation for the LNA in response to the high power pulse. For example, the LNA exhibits about a 67 ns recovery time.

Figure 6:
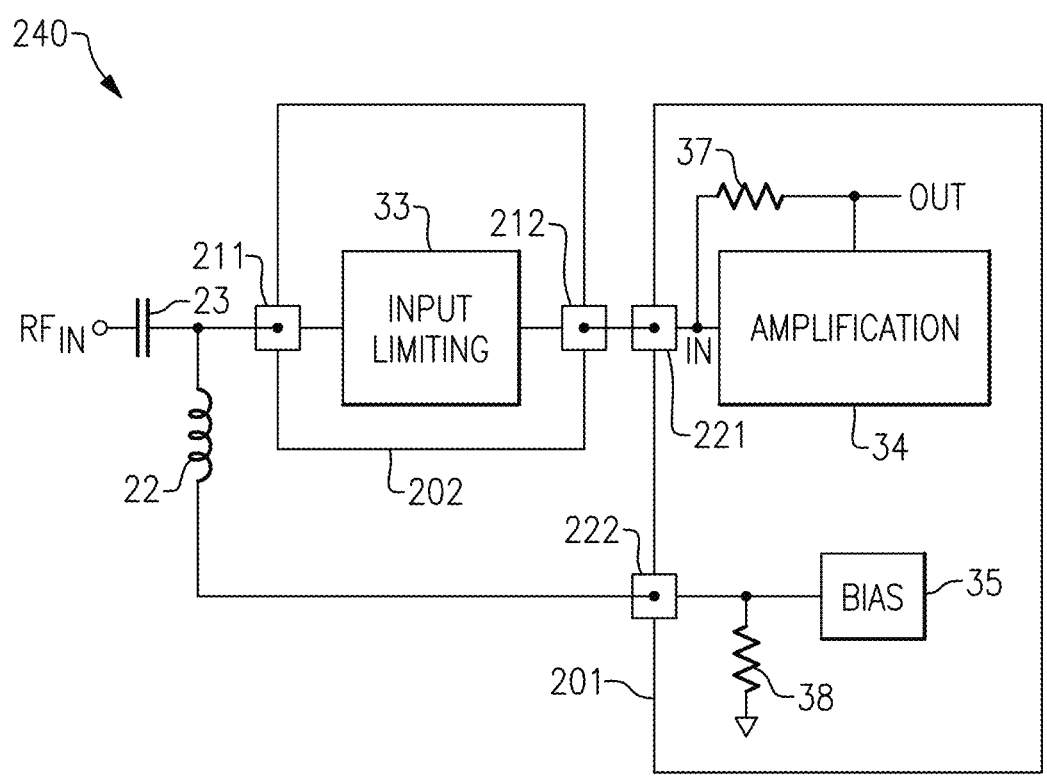
FIG. 6 is a schematic diagram of an RF amplifier according to another embodiment.

FIG. 6 is a schematic diagram of an RF amplifier 240 according to another embodiment. The RF amplifier 240 includes a first IC 201, a second IC 202, a choke inductor 22, and a DC blocking capacitor 23.

The RF amplifier 240 of FIG. 6 is similar to the RF amplifier 40 of FIG. 2, except that the RF amplifier 240 of FIG. 6 depicts an implementation with two ICs. In particular, the first IC 201 includes an RF amplification circuit 34, an input bias circuit 35, a feedback resistor 37, a current sinking resistor 38, an amplifier input signal pad 221, and a bias pad 222. Additionally, the second IC 202 includes an input limiting circuit 33, a limiter input signal pad 211, and a limiter output signal pad 212.

Accordingly, in comparison to the embodiment of FIG. 2 in which the input limiting circuit 33, the RF amplification circuit 34, and the input bias circuit 35 are on the same IC, in the embodiment of FIG. 6 the input limiting circuit 33 is on one IC while the RF amplification circuit 34 and the input bias circuit 35 are on another IC.

The RF amplifiers herein can be implemented on one IC or on multiple ICs in a wide variety of ways. Accordingly, although FIGS. 2 and 6 depict two examples of partitioning of components across ICs, other implementations are possible.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A radio frequency (RF) amplifier comprising:
an RF input terminal configured to receive an RF input signal;
an RF amplification circuit including an input and an output;
a feedback resistor electrically connected between the output and the input of the RF amplification circuit;
an input limiting circuit electrically connected between the RF input terminal and the input to the RF amplification circuit; and
an input bias circuit configured to provide an input bias voltage to the input of the RF amplification circuit through the input limiting circuit, the input bias circuit including a current mirror.

2. The RF amplifier of claim 1, wherein the RF amplification circuit and the input bias circuit are formed on an integrated circuit (IC).

3. The RF amplifier of claim 2, further comprising an inductor external to the IC, wherein the input bias circuit provides the input bias voltage to the input of the RF amplification circuit through the inductor and the input limiting circuit.

4. The RF amplifier of claim 2, wherein the input limiting circuit is also formed on the IC.

5. The RF amplifier of claim 1, wherein the feedback resistor is directly connected between the output and the input of the RF amplification circuit without any intervening capacitor.

6. The RF amplifier of claim 1, wherein the input bias circuit provides the input bias voltage at a bias output, the RF amplifier further comprising a current sinking resistor electrically connected to the bias output and configured to sink a feedback current through the feedback resistor.

7. The RF amplifier of claim 1, wherein the RF amplification circuit includes a cascode amplification stage.

8. The RF amplifier of claim 1, wherein the input limiting circuit includes at least one pair of anti-parallel diodes.

9. A method of radio frequency (RF) signal amplification and limiting, the method comprising:
receiving an RF input signal at an RF input terminal;
limiting the RF input signal using an input limiting circuit electrically connected between the RF input terminal and an input to an RF amplification circuit;
providing feedback from an output of the RF amplification circuit to the input of the RF amplification circuit using a feedback resistor;
providing an input bias voltage from an input bias circuit to the input of the RF amplification circuit through the input limiting circuit; and
generating the input bias voltage using a current mirror of the input bias circuit.

10. The method of claim 9, wherein the RF amplification circuit and the input bias circuit are formed on an integrated circuit (IC), the method further comprising providing the input bias voltage from the input bias circuit to the input of the RF amplification circuit through an inductor and the input limiting circuit, wherein the inductor is external to the IC.

11. The method of claim 9, further comprising providing the input bias voltage from a bias output of the input bias circuit, and sinking a feedback current through the feedback resistor using a current sinking resistor that is electrically connected to the bias output.

12. The method of claim 9, further comprising amplifying the RF input signal using a cascode amplification stage of the RF amplification circuit.

13. The method of claim 9, further comprising limiting the RF input signal using at least one pair of anti-parallel diodes.

14. A radio frequency (RF) communication system comprising:
an antenna; and
an RF amplifier configured to amplify an RF input signal received from the antenna, wherein the RF amplifier comprises:
an RF amplification circuit including an input and an output;
a feedback resistor electrically connected between the output and the input of the RF amplification circuit;
an input limiting circuit electrically connected between the antenna and the input to the RF amplification circuit; and
an input bias circuit configured to provide an input bias voltage to the input of the RF amplification circuit through the input limiting circuit, the input bias circuit including a current mirror.

15. The RF communication system claim 14, wherein the feedback resistor is directly connected between the output and the input of the RF amplification circuit without any intervening capacitor.

16. The RF communication system claim 14, wherein the RF amplifier further comprises an inductor, wherein the input bias circuit provides the input bias voltage to the input of the RF amplification circuit through the inductor and the input limiting circuit.

17. The RF communication system claim 14, wherein a feedback current is configured to flow through the feedback resistor and the input limiting circuit, wherein the RF amplifier further comprises a current sinking resistor configured to sink the feedback current.

18. The RF communication system claim 14, wherein the RF amplification circuit includes a cascode amplification stage.

19. The RF communication system claim 14, wherein the input limiting circuit includes at least one pair of anti-parallel diodes.

20. The RF communication system claim 14, wherein the RF amplification circuit and the input bias circuit are formed on an integrated circuit (IC).

* * * * *